United States Patent [19]
Nichols et al.

[11] Patent Number: 5,818,137
[45] Date of Patent: Oct. 6, 1998

[54] INTEGRATED MAGNETIC LEVITATION AND ROTATION SYSTEM

[75] Inventors: Stephen B. Nichols, Chelsea; Shankar Jagannathan, Waltham; Kevin Leary, Winchester; David Eisenhaure, Hull; William Stanton, Waltham; Richard Hockney, Lynnfield; James Downer, Canton, all of Mass.; Vijay Gondhalekar, New York, N.Y.

[73] Assignee: SatCon Technology, Inc., Cambridge, Mass.

[21] Appl. No.: 548,692

[22] Filed: Oct. 26, 1995

[51] Int. Cl.⁶ .......................................... H02K 7/09
[52] U.S. Cl. ...................... 310/90.5; 310/90; 310/90.5; 310/178
[58] Field of Search .......................... 310/90.5, 86, 178, 310/730

[56] References Cited

U.S. PATENT DOCUMENTS

| | | | |
|---|---|---|---|
| 4,043,614 | 8/1977 | Lyman | 308/10 |
| 4,077,678 | 3/1978 | Studer et al. | 308/10 |
| 4,634,191 | 1/1987 | Studer | 310/90.5 |
| 4,652,820 | 3/1987 | Maresca | 327/207 |
| 5,355,041 | 10/1994 | Shirao et al. | 310/90.5 |
| 5,376,862 | 12/1994 | Stevens | 310/75 D |
| 5,491,396 | 2/1996 | Takahashi et al. | 318/632 |

OTHER PUBLICATIONS

S. Moriyama, N. Hiraki, K. Watanabe, Y. Kanemitsu, "Development of magnetically suspended linear pulse motor for contactless direct drive in vacuum chamber robot," Kyushu Institute of Technology, Transactions of the Institute of Electrical Engineers of Japan, vol. 115–D, No. 3, Mar. 1995, pp. 311–318.

T. Matsumoto, S. Sonoda, T. Suzuki, T. Tsuji, "Two DOF wafer handling robot by electro–magnetic suspension system," Yaskawa Electric Manufacturing Co., Ltd., 4th European Conference on Power Electronics and Applications, 1991, vol. 1, pp. 425–430.

H. Tokisue, H. Inoue, "Particulate–contamination–free wafer–handling systems for gas, liquid, and vacuum environments used in a 64 Mbyte dynamic random–access memory process," Mechanical Engineering Research Laboratory, Hitachi Ltd., Wear, vol. 168, No. 1–2, Sep. 1, 1993, p. 115–120.

M. Kawashima, K. Ueda, Y. Hosoda, T. Shimada, T. Iwamoto, T. Minakata, T. Suzuki, H. Yamaguchi, "Development of a magnetically levitated transport system," Sumitomo Electric Technical Review, No. 29, Jan. 1990, pp. 169–175.

I. Wang, I. Busch–Vishniac, "A new repulsive magnetic levitation approach using permanent magnets and air–core electromagnets," Department of Mechanical Engineering, Texas University, IEEE Transactions on Magnetics, Pt. 1, vol. 30, No. 4, Jul. 1994, pp. 1422–1432.

W. Wang, M. Lamb, I.J. Busch–Vishniac, "An automated loading and unloading system for a maglev wafer transport path," Department of Mechanical Engineering, Texas University, IEEE Transactions on Semiconductor Manufacturing, vol. 6, No. 3, Aug. 1993, pp. 276–279.

*Primary Examiner*—Steven L. Stephan
*Assistant Examiner*—Karl E. Tamai
*Attorney, Agent, or Firm*—Peter J. Manus, Esq.

[57] ABSTRACT

A rotary motor and a rotary magnetic bearing are integrated in a compact assembly that is contact-less. A stator assembly surrounds a ferromagnetic rotor with an annular air gap which can accommodate a cylindrical wall, e.g. of a chamber for semiconductor wafer processing. The stator assembly has a permanent magnet or magnets sandwiched between vertically spaced magnetic stator plates with plural pole segments. The rotor is preferably a ring of a magnetic stainless steel with complementary pole teeth. The stator assembly (i) levitates and passively centers the rotor along a vertical axis and against tilt about either horizontal axis, (ii) provides a radial position bias for the rotor, and (iii) establishes a motor flux field at the rotor poles. Polyphase coils wound on the stator plates produce a rotating flux field that drives the rotor as a synchronous homopolar motor. A rotor without pole teeth allows operation with an asynchronous inductive drive. A controller energizes control coils wound on each stator pole segment in response to a sensed physical position of the rotor. The control coils provide active radial position control and can actively damp tip and tilt oscillations that may overcome the passive centering.

16 Claims, 3 Drawing Sheets

INTEGRATED MAGNETIC LEVITATION AND ROTATION SYSTEM

BACKGROUND OF THE INVENTION

This invention relates in general to magnetic bearings and electromagnetic motors. More specifically, it relates to a process and apparatus providing an integrated, highly compact, integrated rotary magnetic bearing and motor particularly one useful in semiconductor wafer processing.

In semiconductor fabrication, fragile wafers of silicon or other semiconducting materials must be processed in a controlled, super-clean atmosphere, whether that atmosphere is a vacuum, an inert gas, or a process gas. Microscopic contaminates in the atmosphere are a severe problem since they can deposit on the wafer, either directly or as a result of a gaseous processing of the wafer. Microscopic particles on a wafer contaminate it; semiconductor devices made from the contaminated portion of the wafer will be defective. Cleanliness is therefore directly related to yield, which in turn affects final product cost. Modern processing techniques include using multiple chambers connected by vacuum or inert gas-filled transports. These chambers are specialized for certain process steps. Processing usually involves hostile atmospheres of highly corrosive gases and high temperatures.

One processing step is an annealing of the wafer following doping by ion implantation. The implantation produces strains in the crystal structure which, if not relieved, cause unwanted variations in the resistivity of the ion doped silicon. The annealing is important to relieve these stresses. Modern fabrication has turned to rapid thermal processing (RTP) for annealing. RTP involves the use of a radiant heat source (e.g., a lamp) mounted in a vacuum chamber over the wafer. The lamp quickly brings the wafer to a suitably high temperature for the processing. For RTP, it is necessary to have the region over and under the wafer unobstructed.

Uniformity of processing over the entire wafer is important because the wafer is eventually subdivided into multiple discrete devices, e.g., microprocessor or memory chips, that each must have generally the same known characteristics. Uniformity is also important where it is desired to use a relatively large surface area for a single device, e.g., fabrication of an entire computer on a single chip. In short, uniformity also influences yield. To produce uniformity, it is conventional to rotate the wafer about a vertical or z-axis perpendicular to, and centered on, the wafer as it is being processed. Rotation is also used for other wafer processing such as chemical vapor deposition, heat treatment, doping by ion implantation, and doping by other techniques.

Heretofore conventional and RTP wafer processing equipment has used mechanical contact bearings to support a rotatable platform which in turn supports a wafer carrier. Mechanical contact bearings, however, even the custom designed, highly expensive bearings now in use, are the source of many problems. First, because they make moving contact, they wear. This wear is the source of particle contamination. Second, due to the wear and operation in a difficult environment (an ultra-high vacuum) or hostile environment, (e.g., a corrosive or high temperature atmosphere), there are severe constraints on lubrication, the bearings fail unpredictably, and they typically fail in a comparatively short time. (Lubricants evaporate particularly when exposed to a high vacuum. Seals and choice of lubricants can help to control the problem, but bearing lubrication remains a source of contaminants.)

Bearing failure is the cause of significant production down-time. It also raises manufacturing costs due to the direct cost of new bearings and often the loss of a wafer being processed, which may itself have a value in the range of $50,000. Even without bearing failure, wafers break. Besides the loss of the wafer, breakage also produces a significant loss of production time since any wafer break produces wafer fragments and particles which must be meticulously cleaned out of the bearings before the chamber can be used again. When operating, mechanical bearings also produce vibration (they are noisy) and they transmit, and can be worn or damaged by, external mechanical shock and vibration. Mechanical bearings also suffer from stiction and "play" which introduce error in position control which adversely affect quality and yield. These and other problems also impose a practical upper limit on the size of the wafers that are processed and the speed of rotation of the wafer. At present wafers with diameter of about 200 mm are the largest which can be processed reliably. Rotational speeds are typically no greater than 90 rpm for these large wafers.

Magnetic handling has been considered for use in wafer processing. For example, M. Ota et al. in "Development Of Mag-Lev Polar Coordinate Robot Operation in Ultra High Vacuum", *Magnetic Suspension II*, pp. 351–359 (1991) describe a polar coordinate robot for operation in a vacuum using magnetic bearings. Magnetic bearings for contactless suspension and linear movement of wafers is also the subject of papers such as S. Moriyama et al., "Development of Magnetically Suspended Linear Pulse Motor for Contactless Direct Drive in Vacuum Chamber Robot", Kyushu Institute of Technology, Transaction of the Institute of Electrical Engineers of Japan, Vol. 115-D, No. 3, Mar. 1995, pp. 311–318. While the advantages of magnetic suspensions to avoid of contamination problems of mechanical bearings are clear cut, this kind of research has been limited to wafer transport, particularly linear wafer transport between process chambers, not for use in a chamber itself to rotate the wafer during processing.

The general use of magnetic bearings to support a rotary motion are known. The are typically used where it is important to eliminate frictional contact totally. In a common arrangement, a pair of axially spaced magnetic bearings support a rotary shaft which is driven by an axially interposed electric motor. The rotor of the motor is typically secured to the shaft, which is the output shaft of the motor. Magnetic bearings, both radial and axial, are also used in devices as diverse as gyroscopes, flywheels, gas turbines, and electrical measuring instruments.

While the advantage of frictionless operation and operation at a distance to control movement in a sealed chamber or the like are clear, magnetic bearings are not widely used because they are bulky and expensive. Cost is driven up in part by the need for position sensors and active feedback control circuitry to suspend and center the bearing in a preselected spatial location and orientation, typically involving control over six degrees of freedom—linear motion along three mutually orthogonal (x,y, and z) axes and rotation about each of these axes.

It is also known to reduce the cost of active control by passive control of at least one degree of freedom. In a common form, this passive control uses magnetic repulsion between a pair of permanent magnets arrayed along one axis. LC tuned circuits are also known to vary a magnetic field generating current in a coil of inductance value L in a manner which provides a passive control. The coil inductance L and a capacitor with a value C are series coupled. An A.C. excitation frequency is set just above the LC resonant frequency. Because the inductance of the coil is very sensitive to the air gap between the coil and the rotor, changes in the gap automatically produce changes in the impedance of the LC circuit, which in turn adjusts the current flow to induce a centering.

Regardless of whether passive controls are used, if a driven rotating member is magnetically supported, it must also be driven. With a direct mechanical drive, there is the problem of how to transmit the rotary power into a chamber without a frictional contact that is open to the chamber (a source of contaminants) while maintaining a controlled atmosphere within the chamber (e.g. a rotating shaft held in a seal). A magnetic drive can overcome this problem, but it introduces the bulk and cost of this type of drive, as well as further problems such as the interaction of an AC flux of the drive with a DC flux of the suspension. For sealed chamber processing, the AC drive flux produces further complications. The AC flux produces eddy current losses in the chamber wall as well as losses in the stator and rotor. Second, the air gap that accommodates the chamber wall constitutes a significant source of reluctance in the magnetic circuit. Third, the AC flux acting on the rotor competes with the substantial saturation of the rotor by the DC suspension flux. In short, there are significant design consideration that lead away from integrating a rotary magnetic drive with a magnetic suspension.

To date, no known system uses the frictionless suspension of magnetic bearings in wafer processing, such as RTP in combination with a rotary electromagnetic drive of the wafer. More generally, no compact, cost-effective arrangement has been devised which integrates the levitation and frictionless operation of a magnetic bearing with a rotary electromagnetic motor drive.

It is therefore a principal object of this invention to provide a process and apparatus for a combined, integral rotary magnetic bearing and rotary drive that uses no physical contact between moving parts during its operation.

A further principal object of this invention is to provide such an integrated magnetic bearing and drive process and apparatus which are highly compact, both physically and in the active control needed to establish and maintain the bearing gap.

Another object is to provide an integrated magnetic bearing and drive with the foregoing advantages which can operate reliably and with a long life in a vacuum, in a corrosive atmosphere, or at high temperatures such as those encountered in wafer processing, particularly RTP processing.

A further object is to provide an integrated magnetic bearing and drive with the foregoing advantages which can process very large diameter (e.g., >300 mm diameter) wafers and rotate them at over speed ranges from 50 to 1200 rpm.

A still further object is to provide a magnetic bearing and drive for wafer processing which reduces the particulate contaminants in the chamber and production down-time due to particle contamination or mechanical bearing failure.

Another object is to provide an integrated magnetic bearing and drive which allows a high degree of precision in positioning, produces no vibration, and isolates the wafer from external vibration and shock.

Still another object is to provide these advantages with a competitive cost of manufacture.

SUMMARY OF THE INVENTION

A compact, integrated magnetic levitation and rotational drive utilizes a magnetic rotor and a surrounding, non-contacting stator assembly. The stator assembly has a permanent magnet or other source of DC magnetic flux sandwiched between mutually vertically spaced pole pieces, preferably plates, of a ferromagnetic material with a low reluctance. The plates are preferably divided into plural equangularly spaced pole segments, e.g. four segments, that closely surround the rotor with an annular air gap. The rotor is preferably a ring with a complementary set of poles, e.g., eight doubly salient sets of pole teeth, formed on its outer periphery and positioned vertically between the stator plates. This arrangement uses the flux of the permanent magnet to (i) passively center the rotor along a vertical z-axis, (ii) radially bias the x-y position of the rotor within the stator assembly in a horizontal, x-y plane, and (iii) provide a flux field in the rotor poles which can interact with a rotating field established by suitably energized polyphase motor winding s on the stator assembly.

Each stator pole segment carries active position control coils that are preferably wound between arcuate slots in the body of each stator plate. The radial, vertical, and angular positions of the rotor are sensed with eddy current and Hall effect or equivalent sensors positioned proximate the rotor. Closed-loop feedback control circuits of a controller produce currents that energize the control coils to produce a magnetic flux that adds or subtracts from the DC flux field produced by the permanent magnet. The currents adjust the flux field strength to maintain the rotor in a radially centered x-y position. It can also operate to control oscillations of the rotor out of the x-y plane which the passive reluctance centering of the permanent magnet flux field cannot control, at least at high rotational speeds. Ideally out-of-plane vibrations are controlled solely by passive means such as inter connection of coils and selection of materials such that these vibrations cause eddy currents to be generated which damp the oscillations.

An alternative form of the invention use a toothless rotor to provide an asynchronous induction motor. Alternative passive radial position controls use capacitors in series with the active control coils and AC excitation of the LC circuit set just above its resonant frequency. Changes in the stator-to-rotor air gap couple to the coil to produce changes in the inductance L of the coil, which causes the current to vary in a manner that drives the rotor toward the desired centered position. Position sensing can also be estimated. A small signal is superposed on the control coil current at a high carrier frequency to monitor the air gap in the magnetic circuit. Another position estimation method measures the control coil current directly. A microprocessor analyzes the sensed coil current to yield radial position information.

These and other features and objects of the present invention will be more fully understood from the following detailed description which should be read in light of the accompanying drawings.

DETAILED DESCRIPTION OF THE PREFERRED EMBODIMENTS

Figure 1:
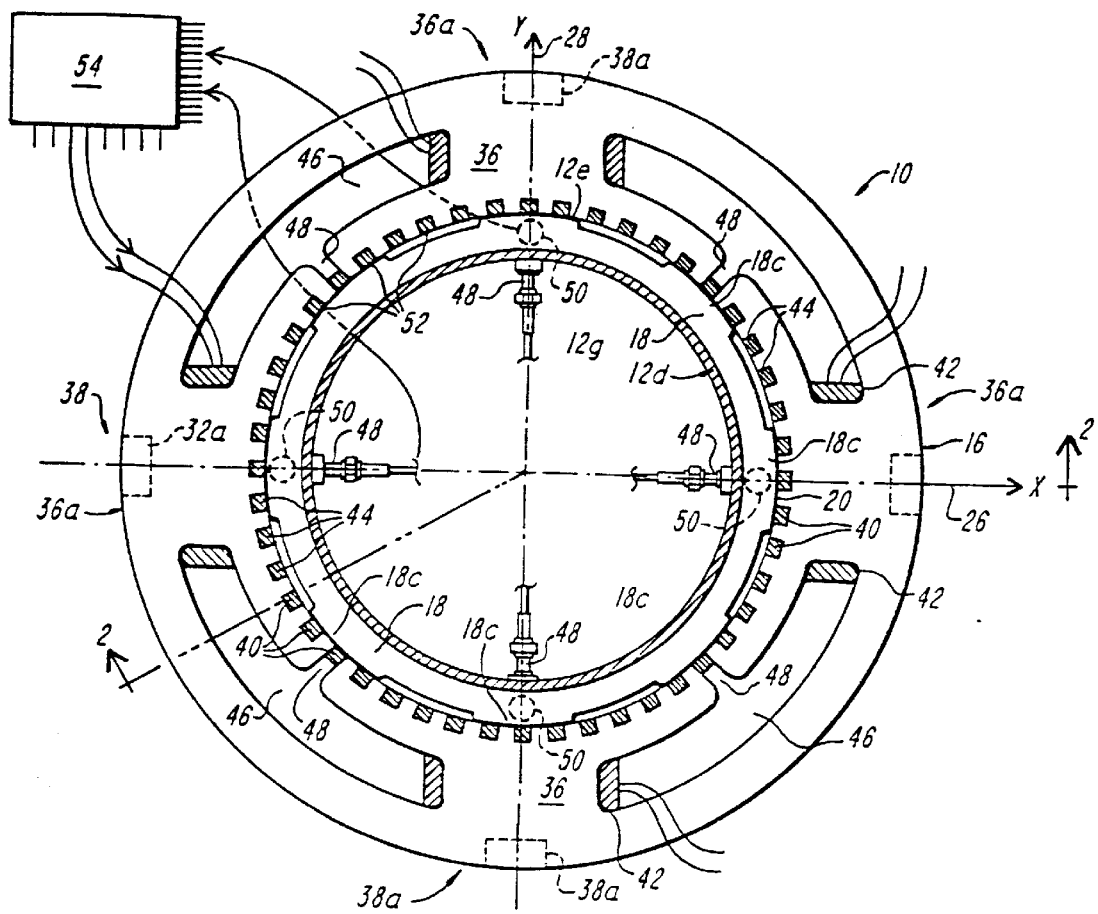
FIG. 1 is a view taken along the line 1—1 in FIG. 1.
Figure 2:
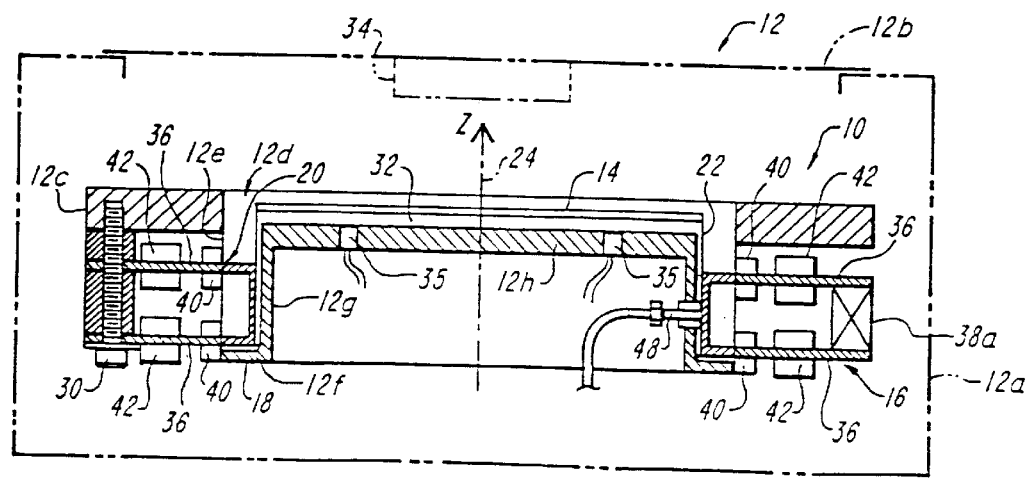
FIG. 2 is a view in vertical section of an integrated magnetic levitation and rotation assembly according to the present invention operating in conjunction with a chamber, shown in phantom, for RTP of a semiconductor wafer.
Figure 3:
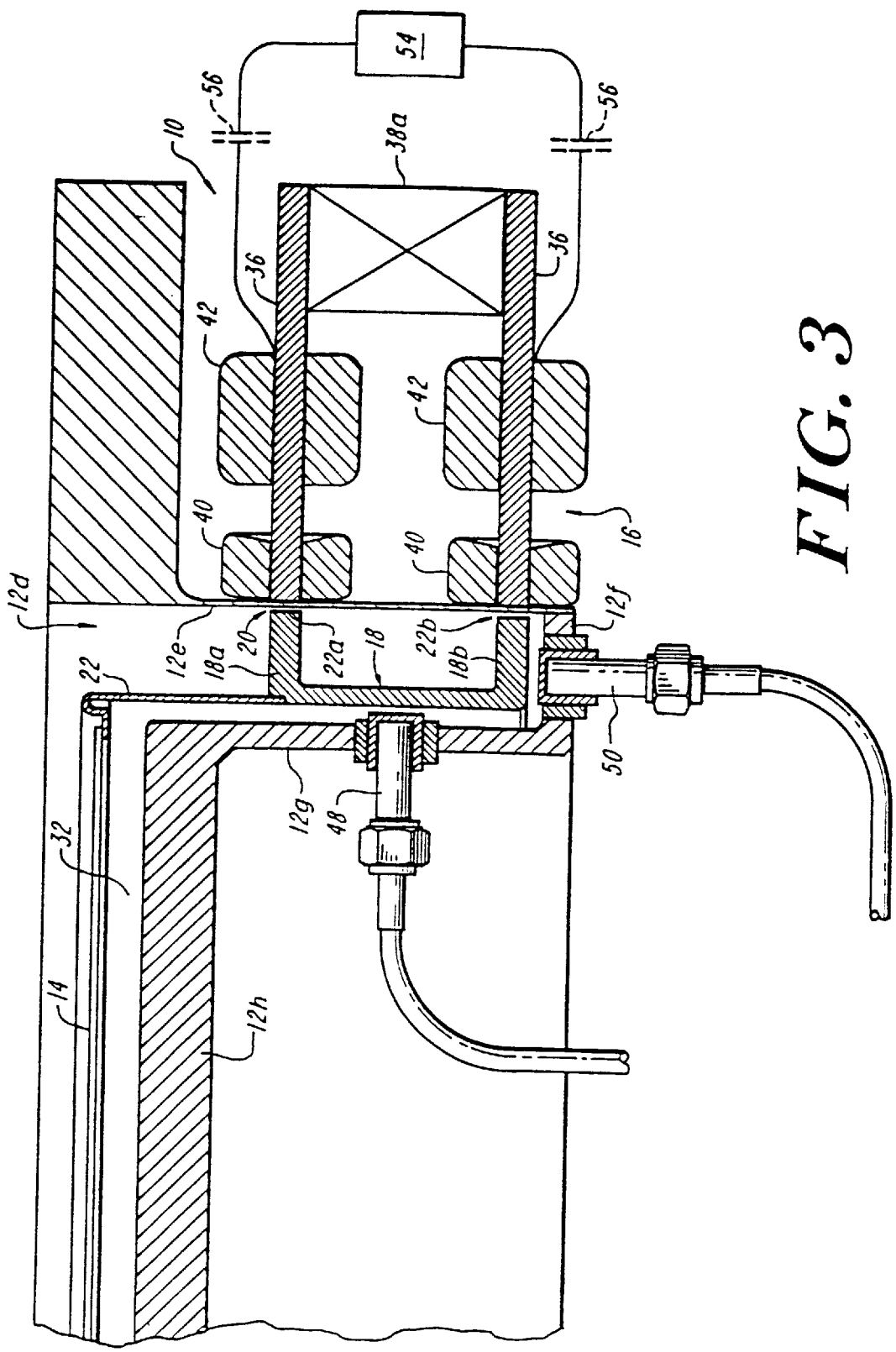
FIG. 3 is a detailed view in vertical section of the stator assembly and rotor shown in FIGS. 1 and 2 and adjacent portions of the chamber wafer carrier and a wafer.

FIGS. 1–4 show an integrated magnetic motoring and suspension system (IMMSS) 10 according to the present invention adapted for use in conjunction with a sealed chamber 12 for processing silicon wafers 14 into multiple discrete semiconductor devices such as microprocessors or memory chips. The IMMSS 10 features a stator assembly 16 that surrounds a rotor 18 with a radial spacing, a thin annular air gap 20. The rotor 18 supports, and is replaceably coupled to, a wafer carrier 22, which in turn carries the wafer 14 on its upper surface. The rotation of the rotor about a vertical z-axis 24 rotates the carrier 12 and wafer 14 about the same z-axis, which during operation is generally coincident with a common centerline of the rotor, carrier, and wafer. Rotation of these elements is preferably constrained to lie a single horizontal x,y plane where the x-axis 26, y-axis 28 and z-axis 24 are mutually orthogonal.

The invention will be described herein with reference to its present principal application, the successive processing of multiple wafers 14 in the chamber 12, and in particular, a rapid thermal processing (RTP) of the wafer 14 to relieve crystal lattice strain produced by dopant ion implantation. However it will be under stood that the invention is useful in other semiconductor processing steps where it is necessary or desirable to rotate a wafer in a controlled or hostile environment, or more broadly, whenever it is required to rotate and suspend a body, particularly where the body is in a controlled atmosphere.

The RTP chamber 12 has a lower housing 12a and an upper housing cover 12b that mate in a seal sufficient to maintain a vacuum within the chamber (e.g. 0.001 Torr), but also separate to allow direct access to the interior of the chamber as necessary. Screws 30 secure that stator assembly 16 to a wall 12c of the chamber housing 12a. The rotor 18 is received in an annular well 12d formed by a cylindrical chamber wall 12e, a bottom flange 12f, and a cylindrical wall 12g capped by a circular bottom plate 12h which underlies the wafer carrier 22 with a clearance 32.

This geometry allows a simple drop-in insertion and removal of the rotor 18 from the chamber, which, because the rotor is ferromagnetic, can be performed magnetically using robotics, or manually. If there is a wafer break, removal of the rotor 18, carrier 22, and the remains of the wafer 14 leaves only smooth surfaces that can be readily cleaned of wafer particles in a small fraction of the time required to clean conventional mechanical bearing assemblies. This geometry also leaves access to the wafer, wafer carrier, and the wafer unobstructed from above and below. This is important in establishing a well defined thermal gradient across the wafer using a lamp 34, or equivalent source of radiant thermal energy, under the control of one or more optical pyrometers 35, or the like, mounted in the housing portion 12h. This geometry is also highly compatible with a fully robotic, fully integrated magnetic handling and transport system which positions the wafer and/or its carrier and transports it or them to and from other processing stations.

As well be discussed below, a rotor-levitating magnetic flux flowing from an upper pole piece of the stator assembly, through the rotor to a lower pole piece as elements of a common magnetic circuit is central to the operation of the IMMSS. Therefore, the wall 12e in the annular gap 20 must be thin, nonmagnetic and not introduce significant eddy current losses. In the presently preferred embodiment, with a rotor diameter of twelve inches (307 mm), the wall 12e is preferably 0.035 inch thick and formed of type 316 stainless steel. The other chamber walls are also preferably formed of the same material.

The stator assembly 16 has a pair of vertically spaced pole pieces 36, 36 in the form of generally flat plates that sandwich a permanent magnet 38, which, as shown, is preferably four identical, equiangularly-spaced permanent magnets 38a, each associated with, and angularly centered on, a pole segment 36a. The four magnets 38a are mounted generally at the outer periphery of the plates 36, 36. They are capable of producing a strong DC magnetic flux field at the rotor despite the presence of air gaps. The DC flux field is strong enough to levitate the rotor and stiffly center it vertically. Magnets of samarium cobalt, various grades of neodymium boron iron, and ceramics are suitable. Ceramic ferrite magnets are preferred for low cost. Samarium cobalt may be used where the operating temperature range and demagnetization are concerns. Neodymium offers the most magnetic flux for a given size.

The plates 36,36 are formed of a magnetic material with a high magnetic permeability and a corresponding low reluctance. Low carbon steel is preferred due to its low cost. The DC magnetic flux produced by the magnetic flow from the upper pole plate, across the gap 22— which in the illustrated embodiment includes the chamber wall 12e— to the rotor 18 which closes this magnetic circuit. In the preferred form shown, the high reluctance air gaps between the rotor and stator plates are minimized by forming two radially outward extending flanges 18a and 18b on the rotor. They are mutually spaced in the vertical direction so that they each can align generally with one of the plates 36. The rotor is also formed of a ferromagnetic material with a high magnetic permeability and corresponding low reluctance. Preferably the rotor is a ring of low carbon steel with a nickel plating. Alternatively, silicon steel can be used for lower reluctance or 17-4PH stainless steel for higher corrosion resistance.

The DC flux set up by the permanent magnet 38 and its pole pieces 36, 36 induces a magnetic flux field in the rotor of opposite polarity, much as a permanent magnet magnetizes a nearby soft iron member with an opposite polarity, causing them to be drawn toward one another (and thereby minimizing the intervening air gap, which reduces the reluctance of the magnetic circuit). Similarly the stator assembly 16 and rotor 18 are constructed to utilize this tendency to minimize the circuit reluctance to close the air gaps 22a and 22b between the upper and lower plates 36 and the flanges 18a and 18b respectively. The magnetic forces in these air gaps are analogous to a pair opposed mechanical springs that combine produce a leveling effect as well as the levitation of the rotor. The rotor flanges each have eight poles 18c sized and spaced to match the four stator poles segment 36a, as shown in FIG. 1. Because there are two flanges 18a and 18b, poles 18c are formed in a matching pattern on both flanges to produce a like saliency.

The DC flux of the permanent magnet also produces an attractive magnetic force between the poles of the stator and the rotor. This attractive force is radially directed and establishes a radial bias. However, it is unstable and tends to pull the rotor radially to one side. Additional radial positions controls are therefore necessary, as will be discussed below. It is also important that the DC magnetic flux of the permanent magnet 38, by magnetizing the rotor and its pole teeth, also induces a rotor flux field. The rotor field interacts with a rotating electromagnetic field to develop a torque about the z-axis, and thereby drive the rotor.

The stator assembly includes two sets of coils, a drive coil 40 and multiple active control coils 42 each associated with one plate of one of the pole segments 36a. The drive coil 40 is preferably a polyphase winding with end windings held in a series of notches 44 formed on the inner edges of the stators plates 36,36. The drive winding 40 is energized by a conventional multiphase AC drive current to develop a rotating electromagnetic field that interacts with the DC magnetic flux field of the rotor to cause it to rotate.

The control coils 42 are eight in number, each wound on one of the upper and lower plates 36,36 through body-centered arcuate slots 46 that are also angularly centered on radial slots 48 that separate and define the stator poles segments 36a. The control coils 42 each carry a control current that produces a magnetic flux. Depending on the direction of the current, this flux adds or subtracts from (modulates) the DC magnetic field acting on the rotor. Coordinated adjustments in these currents stabilize the radial position and orientation of the rotor, both static and dynamic. The radially centered rotor position leaves a clearance on both sides of the rotor so that there is no frictional contact with the chamber walls as it rotates. The aforementioned levitation raises the rotor from the flange 12f at the bottom of the well 12d.

Because there are coils on both pole pieces forming each pole segment, adjustments in the coil currents in vertically paired coils can also control the tip or tilt of the rotor out of a desired x–y plane. Note that the passive reluctance centering produced by the DC magnetic field also passively controls tip and tilt, but if this controlling field is weak, or if the rotational speed is sufficiently high, there is a tendency for the rotor nevertheless to oscillate out of the desired x–y plane, or to reach a tilted equilibrium position. The control coils 42, energized in a "push-pull" manner in a vertically spaced pairs as well as on diametrically opposite sides of the rotor maximize control over such oscillations, or any deviations of the rotor from the preselected vertical position and preselected horizontal orientation.

In the presently preferred form shown for high speed operation with active position control, four radial positions sensors 48, four vertical position sensors 50, and three commutation sensors 52, are mounted proximate the rotor in the side chamber wall 12g, bottom flange 12f, and on the inner periphery of the pole pieces 36, 36 respectively. The position sensors are standard eddy current sensors, or known equivalents. They produce signals which correspond to the physical position, radial and vertical, of the rotor. The commutation sensors 52 are standard Hall effect sensors; they sense the angular position of the rotor as determined by the presence or absence of a tooth 18c. Angular position is used for conventional electronic commutation of the drive windings 40. The sensors 52 are preferably mounted in alternate notches 44 in the pole plate 36, over the drive winding 40 in that notch. Radial and vertical position information is input to a controller 54 which produces output currents to each of the position control coils 42. For clarity, the lines connecting the sensors and coils to the controller 54 are shown in FIG. 1 only with respect to one coil 42 and two sensors 48 and 50. However, it will be understood that output signals from all sensors 48 and 50 are supplied as inputs to the controller 54.

The controller 54 is preferably Texas Instruments model DSP C30 controller, by or any of a variety of equivalent devices well known to those skilled in the art. The magnitude and direction of the current applied to the associated coils 42 produces a modulation of the flux field at the rotor which (i) actively radially centers the rotor. Because three degrees of freedom — position along the z-axis and rotation about x and y axes — are controlled passively, the cost and bulk of the active control circuiting is reduced substantially as compared to a system of total active control in all degrees of freedom. The control current can also actively control tip and tilt out of a preselected x–y plane, and in particular damp oscillations which appear at high rotational speeds and which the passive vertical centering of the DC magnetic flux is not able to control adequately.

Figure 4:
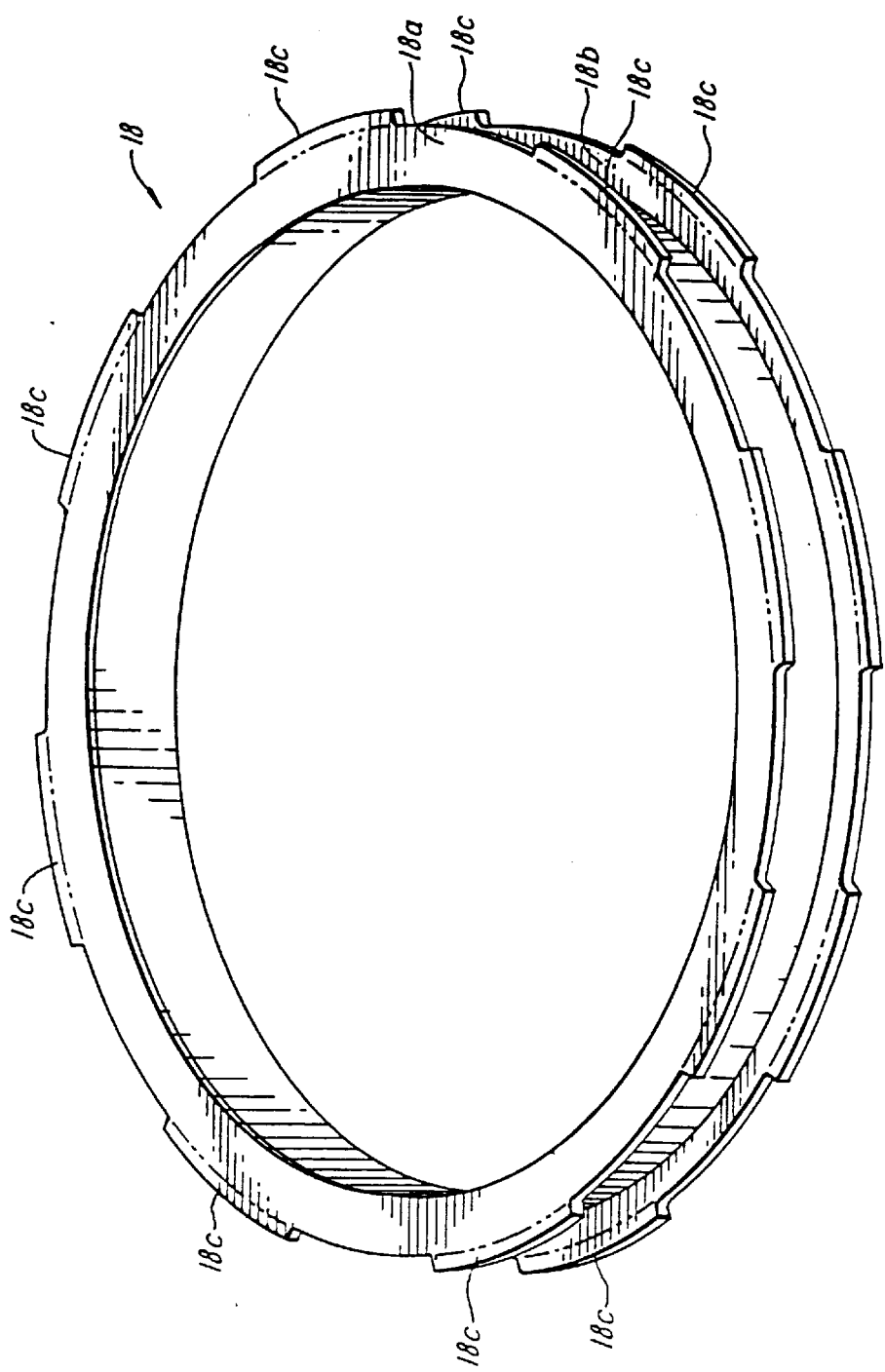
FIG. 4 is a perspective view of the rotor shown in FIGS. 1–3.

By way of illustration, but not of limitation, for a rotor with a twelve inch (307 mm) diameter with eight doubly salient poles made of stainless steel in the form shown in FIG. 4, the rotor has a weight of about 5.5 pounds (2.5 kg). A quartz ring carrier 22 and wafer 14 have a weight of 2.0 pounds for a total weight of 7.5 pounds (3.4kg) to be levitated, centered and rotated. A magnetic gap 22 of 0.080 inch, a housing wall 12e thickness of 0.025 inch (0.6 mm) of 316 stainless steel, and the pole count and type described and shown above, the permanent magnet 38 develops a field of 3,500 gauss for the levitation, reluctance centering, radial housing and rotor field magnetization. The rotor is suspended with a vertical stiffness of about 200 lbs./inch. The control coil 42 has a maximum power rating of 18 watts per axis. The running power is about 1 watt per axis. Operated as a synchronous homopolar motor, this IMSS develops a maximum torque of 3.0 Nm with a maximum rotational speed of 1200 rpm, taking about 6.0 seconds to spin up to operating speed from a standstill. Maximum motor power at spin up is 200 watts, and the power at normal operating speed is estimated at about 100 watts, which in part reflects eddy current losses.

While the preferred embodiment uses position sensors and a position controller, the sensors and their associated electronics are a major cost component of the IMMSS 10. An alternative embodiment reduces these costs with passive radial position control. A capacitor 56 (shown in phantom) is connected in series with each radial control coil 42. A fixed amplitude, fixed frequency A.C. voltage excites the circuit. The circuit has a resonance at a frequency $f_n = \sqrt{1/LC}$, where L is the inductance of each coil 42 and C is the capacitance of the associated capacitor 56. At the resonant frequency $f_n$, the impedance of the LC circuit is purely ohmic, and the current in the coils is therefore large. By operating about a nominal coil inductance, at a frequency slightly above $f_n$, the impedance of the LC current becomes highly sensitive to the magnetic air gap 22. As the gap opening g decreases, the inductance increases since L is proportional to 1/g. The resonant frequency decreases, impedance increases, and the current decreases. The opposite occurs in the diametrically opposed coil. These current changes, responsive to rotor position changes, particularly when operating in a "push-pull" fashion with diametrically opposed control coils 42, allows passive radial position stabilization without radial position sensors and without the attendant controller electronics, at least for certain conditions. Limitations of this approach include increased power losses in the chamber wall due to the eddy currents set up by the AC excitation, interference with the AC motoring excitement of the drive coil 40, limited flexibility in tailoring the system dynamics, and reduced damping capabilities.

Another alternative to radial position control, one which eliminates the sensors, but not the controller, is position estimation. One method superposes a small signal as a high carrier frequency on the control coil current. This high frequency signal provides a measure of the impedance (as discussed above with respect to the LC circuit), which in turn is a measure of the air gap in the magnetic circuit, and hence of the position of the rotor. A second method directly measures the current in the control coils 42. The sensed current value, as noted above, is a function of the inductive impedance of the associated coil 42, which in turn is a function of the magnitude of the air gap 22. A micropressor in the controller is programmed to translate the sensed current changes into rotor position changes. The controller then uses this position information in the usual way to make the appropriate corrections in the control coil currents to drive the rotor to a pre-selected position and orientation. As used herein, "sensing" is mean to include position sensing using transducers as well as the LC and estimation approaches described herein and other techniques known to those skilled in the art. As noted above, ideally position control is totally passive to avoid the cost of sensors and active control electronics. Total passive control works well for sufficiently low rotational speeds, but for operation high speeds, e.g. 1200 rpm, some degree of active control is preferred.

While the invention has been described with respect to a homopolar motor, it is also possible to use the IMMSS 10 with an induction motor. This allows the system to operate off a fixed frequency and excitation voltage. It also eliminates the proximity sensors 52 and electronic commutators for the phase currents of the homopolar motor. Further, an induction motor avoids the torque fluctuations produced by the poles of the homopolar motor. The IMMSS 10 is able to operate as an asynchronous induction motor simply by removing the rotor teeth 18c, as shown in phantom in FIG. 4. The problem of an induction drive is the strong AC field necessary to spin up to normal operation at the fixed frequency.

With the homopolar motor, different poles shapes and counts can be used. Two to eight pole pairs are preferred. Higher pole counts reduce the amount of steel required in the rotor and stator, but increases in the required excitation frequency and the magnetizing current are required. End turn volume and chamber wall losses are also design considerations.

There has been described an integrated magnetic motoring and suspension system which can be used in semiconductor wafer processing to rotate the wafer in a chamber with a controlled and hostile atmosphere without moving contact which itself generates particle contaminants. The integration lends itself to a high degree of compactness which is necessary for a commercially practical IMMSS. The IMMSS of the invention reduces wafer production down-time due to bearing failure and to clean up associated with wafer breaks and bearing failure. It is also highly compatible with robotics that can provide fully integrated, contact-less wafer fabrication. It also allows the processing of larger diameter (e.g. >300 mm) wafers and at higher rotational speeds (e.g. 1200 rpm) than heretofore possible with conventional equipment using mechanical bearings. It allows precise positioning of the wafer not impaired by friction and stiction. It has a long operational life as compared to conventional mechanical bearing wafer processing systems. It produces no mechanical vibration and isolates the wafer from external vibration and shock. It also provides excellent in-chamber geometry — the region above and below the wafer is unobstructed, there are few internal components, and those few components are readily removed and cleaned. The system described herein is also highly flexible. It can handle different rotated bodies (wafer, non-wafers, wafers of varying sizes), different operating environments, a range of rotational speeds, and a wide range of other cost/performance trade-offs.

While the invention has been described with respect to its preferred embodiments, it will be understood that various alterations and modifications will occur to those skilled in the art from the foregoing detailed description and the accompanying drawings. For example, while the invention has been described with respect to permanent magnets 38a establishing the DC flux field, it is possible to use an iron-core coil or coils, or other equivalents such as combination of coils and magnetic materials. As used herein, "permanent magnet" includes all sources of DC magnetic flux. Likewise, while plate-type pole pieces have been described with four pole segments, this particular geometry and pole count is not essential. What is essential is to have poles which carry the flux across a small air gap to the rotor so that the flux simultaneously performs the levitation, radial biasing and rotor flux field magnetization functions described above. Similarly, while the field coils and control coils are described as end-wound and centrally-wound, respectively, other locations for these windings are possible. However, to modulate the DC flux, the control coils should be directly coupled with the DC magnetic circuit. The stator and rotor can also be laminated to control eddy current losses, but with attendant increases in cost. Likewise, the rotor can be formed with a different number of poles, single salient pole teeth, or, as described above with respect to an asynchronous inductive motor, with no pole teeth. These and other modifications and variations occurring to those skilled in the art are intended to fall within the scope of the appended claims.

What is claimed is:

1. A process for rotating and levitating a mass within a cylindrical wall about a vertical z-axis with a motor having a stator assembly and a rotor, the rotating occurring without frictional contact between the stator assembly and the rotor, and with the cylindrical wall located in an air gap between the stator assembly and the rotor, comprising, forming the rotor as a ring of a ferromagnetic material with a high magnetic permeability and with two flanges mutually spaced along the z-axis and each extending toward the stator assembly, forming the stator assembly as a pair of pole plates that are each vertically aligned with one of said flanges and which sandwich a permanent magnet, said pole plates having a polyphase drive coil and position control coils wound thereon, said position control coils being wound on a plurality of angularly spaced pole segments, passively levitating and centering the rotor in the stator assembly along the z-axis with a DC magnetic flux field, which also centers the rotor against tilt out of a plane orthogonal to the z-axis, said DC flux field originating at said permanent magnet of the stator assembly, simultaneously radially biasing the rotor with said DC magnetic flux field, simultaneously inducing a flux field in said rotor with said DC magnetic flux field applied across the air gap and through the cylindrical wall, driving the rotor to rotate about the z-axis using a rotating electromagnetic field produced by said drive coil at the stator assembly which interacts with said flux field induced in the rotor by said DC magnetic flux field, said rotating electromagnetic field being applied across said air gap and through the cylindrical wall, sensing at least the radial position of the rotor with respect to the stator assembly, and adjusting with said control coils the DC magnetic flux at angularly spaced regions about the stator assembly in response to said sensing to maintain spacing between said rotor and said stator assembly during said driving.

2. The process of claim 1 wherein said rotor is a continuous ring of a ferromagnetic material and said passive z-axis centering is a reluctance centering of the ring.

3. The process of claim 2 wherein said driving is synchronous and homopolar.

4. The process of claim 2 wherein said driving is asynchronous and inductive.

5. The process of claim 1 wherein said adjusting is active and produced by said control coils at each of said regions and altering an excitation current in said control coils.

6. The process of claim 1 wherein said adjusting is passive and produced by tuning an AC excited LC circuit at each of said regions where the inductance L is that of a coil in one of said angularly spaced regions whose magnetic field produces said adjusting without the aid of discrete position sensors.

7. The process of claim 1 wherein said adjusting is produced by a dynamic estimation of the rotor-to-stator assembly spacing without the aid of discrete position sensors.

8. An integrated magnetic motor and suspension system that rotates a mass about a vertical z-axis that is mutually orthoganal with x and y axes, comprising,
   a cylindrical wall,
   a ring-like rotor formed of a ferromagnetic material with a pair of flanges that each project radially and are mutually spaced along said vertical z-axis,
   a stator assembly that extends generally in said x–y plane and surrounds the rotor in a closely spaced relationship, said stator assembly having
      (i) upper and lower pole pieces that are each vertically aligned with one of said rotor flanges in said spacing with said cylindrical wall interposed,
      (ii) a permanent magnet coupled between said upper and lower pole pieces to produce a DC magnetic flux field across said spacing and through said wall that (a) passively reluctance centers the rotor along the z-axis and in an orientation generally orthogonal to the z-axis, (b) provides a radial bias force on the rotor, and (c) induces a DC flux field at said rotor,
      (iii) windings mounted on said pole pieces to drive the rotor to rotate about the z-axis through an interaction with said DC flux field at said rotor, said driving occurring across said spacing and though said cylindrical wall, and
      (iv) a plurality of position control coils equiangularly spaced around said stator assembly which produce a magnetic flux that adds and subtracts from the flux field of said DC permanent magnetic field to radically center said rotor with respect to said stator assembly and to supplement the passive tilt control of said permanent magnetic,
   means for sensing at least the actual radial position of the rotor and producing an electrical signal indicative of the sensed radial position, and
   means for producing position control currents in each of said plurality of position control coils in response to said electrical signal that produce said magnetic flux adding and subtracting.

9. The integrated magnetic motor and suspension system of claim 8 wherein said rotor is a continuous ring with plural pole teeth formed at its periphery and wherein said pole pieces have corresponding poles formed on their rotor-facing peripheries to produce a synchronous homopolar drive.

10. The integrated magnetic motor and suspension system of claim 8 wherein said rotor is a continuous ring with no pole teeth and said stator assembly windings produce an asynchronous inductive drive for said rotor.

11. The integrated magnetic motor and suspension system in claim 8 wherein said coils are active coils disposed in diametrically opposed arrays on said pole pieces.

12. The integrated magnetic motor and suspension system of claim 11 wherein said coils are active coils also disposed in vertically aligned pairs each associated with one of said pole pieces.

13. The integrated magnetic motor and suspension system of claim 8 wherein said coils are each connected in series with a capacitor and excited by an AC current at a frequency such that the inductance of the associated coil provides a passive radial position control over said rotor.

14. The integrated magnetic motor and suspension system of claim 8 wherein said position control current producing means includes means for sensing the magnitude of said currents and calculating from said sensed magnitudes the radial position of the rotor with respect to the stator assembly.

15. The integrated magnetic motor and suspension system of claim 8 wherein said sensing means comprises a plurality of radial and vertical rotor position sensors.

16. An integrated magnetic support and rotational drive for processing semiconductor wafers in a sealable chamber, that includes a cylindrical side wall comprising,
   a rotor with plural poles formed of a ferromagnetic material located in the chamber and adapted to support the wafer in the chamber and rotate it about a vertical z-axis while it extends in an x–y plane orthogonal to said vertical z-axis, said rotor being formed of a ferromagnetic material with a high magnetic permeability and with a pair of vertically spaced flanges,
   a stator located outside said chamber and surrounding said rotor in a closely spaced relationship having,
      (i) a permanent magnet whose DC flux, acting across said spacing and through said cylindrical side wall, levitates said rotor, radially biases the position of said rotor, and induces a DC flux field in said rotor,
      (ii) upper and lower stator plates aligned with said pair of flanges that sandwich said permanent magnet and are each divided into plural equiangularly-spaced pole segments,
         (a) a polyphase winding wound on said stator that surrounds said rotor and produces a rotating electromagnetic field that interacts with said induced DC flux in said rotor to rotate said rotor and the wafer supported on said rotor about said z-axis in said x–y plane,
         (b) a plurality of position control coils wound on each of said stator plate segments,
   rotor position sensing means that determine at least the radial and vertical positions of said rotor, and
   a feedback control circuit responsive to said position sensing means that said position control coils to center said rotor radially and against tilt out of said x–y plane by modulating the DC flux of said permanent magnet acting on said rotor.

* * * * *